US010725221B2

(12) United States Patent
Jurik et al.

(10) Patent No.: US 10,725,221 B2
(45) Date of Patent: *Jul. 28, 2020

(54) LIGHT PIPES FOR LED ARRAY LUMINAIRE

(71) Applicant: Robe Lighting s.r.o., Roznov pod Radhostem (CZ)

(72) Inventors: Pavel Jurik, Prostredni Becva (CZ); Josef Valchar, Prostredni Becva (CZ)

(73) Assignee: Robe Lighting s.r.o., Roznov pod Radhostem (CZ)

( * ) Notice: Subject to any disclaimer, the term of this patent is extended or adjusted under 35 U.S.C. 154(b) by 0 days.

This patent is subject to a terminal disclaimer.

(21) Appl. No.: 16/654,951

(22) Filed: Oct. 16, 2019

(65) Prior Publication Data

US 2020/0041711 A1 Feb. 6, 2020

Related U.S. Application Data

(63) Continuation of application No. 16/425,554, filed on May 29, 2019, now Pat. No. 10,495,802.

(Continued)

(51) Int. Cl.
*F21V 8/00* (2006.01)
*H01L 25/075* (2006.01)
(Continued)

(52) U.S. Cl.
CPC .............. *G02B 6/0008* (2013.01); *F21V 3/00* (2013.01); *F21V 5/007* (2013.01); *F21V 13/02* (2013.01);
(Continued)

(58) Field of Classification Search
CPC .............. G02B 6/0008; G02B 27/0994; H01L 25/0753; F21V 14/06; F21V 13/02;
(Continued)

(56) References Cited

U.S. PATENT DOCUMENTS 3,752,561 A    8/1973 Klemt
9,411,083 B2   8/2016 Angelini et al.
(Continued)

FOREIGN PATENT DOCUMENTS

EP    3130843 A1    2/2017

OTHER PUBLICATIONS

Notice of Allowance dated Jul. 15, 2019; U.S. Appl. No. 16/425,554, filed May 29, 2019; 8 pages.
(Continued)

*Primary Examiner* — Evan P Dzierzynski
(74) *Attorney, Agent, or Firm* — Conley Rose, P.C.; Grant Rodolph; Brooks W Taylor

(57) ABSTRACT

An optical system and luminaire are provided. The luminaire includes a plurality of LED die sets, a plurality of light pipes corresponding to the LED die sets, and a plurality of light pipe holders corresponding to the light pipes. Each of the LED die sets includes a plurality of LED dies. The LED dies of at least one LED die set emit light beams of a plurality of colors that corresponds to the plurality of LED dies. The light pipe holders are configured to hold their light pipes in positions optically coupled to corresponding LED die sets. The light pipe corresponding to the at least one LED die set has an output face, an input face to receive a light beam, and a body extending from the input face to the output face. A cross-section of the body rotates along a central axis extending between the input face and the output face.

20 Claims, 10 Drawing Sheets

Related U.S. Application Data

(60) Provisional application No. 62/678,122, filed on May 30, 2018.

(51) Int. Cl.
| | |
|---|---|
| *F21V 3/00* | (2015.01) |
| *F21V 14/06* | (2006.01) |
| *F21V 5/00* | (2018.01) |
| *G02B 27/09* | (2006.01) |
| *F21V 13/02* | (2006.01) |
| *F21Y 113/17* | (2016.01) |
| *F21Y 115/10* | (2016.01) |
| *F21Y 105/18* | (2016.01) |
| *F21Y 113/13* | (2016.01) |
| *F21W 131/406* | (2006.01) |

(52) U.S. Cl.
CPC .......... *F21V 14/06* (2013.01); *G02B 27/0994* (2013.01); *H01L 25/0753* (2013.01); *F21W 2131/406* (2013.01); *F21Y 2105/18* (2016.08); *F21Y 2113/13* (2016.08); *F21Y 2113/17* (2016.08); *F21Y 2115/10* (2016.08)

(58) Field of Classification Search
CPC ........ F21V 5/007; F21V 3/00; F21Y 2113/13; F21Y 2113/17; F21Y 2105/18; F21Y 2115/10; F21W 2131/406
See application file for complete search history.

(56) References Cited

U.S. PATENT DOCUMENTS

| | | | |
|---|---|---|---|
| 9,772,499 | B2 | 9/2017 | Angelini et al. |
| 10,495,802 | B2 * | 12/2019 | Jurik .................... F21V 5/007 |
| 2008/0013911 | A1 | 1/2008 | Jennings |
| 2008/0137361 | A1 * | 6/2008 | Ho .................... G02B 6/0006 362/555 |
| 2014/0301071 | A1 | 10/2014 | Jorgensen et al. |
| 2015/0277035 | A1 | 10/2015 | Bryan et al. |
| 2017/0351101 | A1 | 12/2017 | Angelini et al. |
| 2018/0024441 | A1 | 1/2018 | Markle et al. |
| 2019/0278012 | A1 * | 9/2019 | Jurik .................... F21V 3/00 |

OTHER PUBLICATIONS

European Extended Search Report; Application No. 19177453.8; dated Oct. 4, 2019; 12 pages.

* cited by examiner

LIGHT PIPES FOR LED ARRAY LUMINAIRE

CROSS-REFERENCE TO RELATED APPLICATIONS

This application is a continuation of U.S. patent application Ser. No. 16/425,554 filed May 29, 2019 by Pavel Jurik, et al. entitled, "Light Pipes for LED Array Luminaire", which claims priority to U.S. Provisional Application No. 62/678,122 filed May 30, 2018 by Pavel Jurik, et al. entitled, "Light Pipes for LED Array Luminaire", both of which are incorporated by reference herein as if reproduced in their entirety.

TECHNICAL FIELD OF THE DISCLOSURE

The disclosure generally relates to a light-emitting diode (LED) luminaires, specifically to light pipes for an LED luminaire.

BACKGROUND

Many entertainment lighting fixtures use LED light sources to reduce power requirements and generated heat. The LED source often includes LEDs of differing colors, e.g., red, blue, green, and white. An operator can adjust the beam to a desired color by remotely adjusting the relative brightness of the colors.

SUMMARY

In a first embodiment, an optical system includes first and second LED die sets, first and second light pipes, and first and second light pipe holders. Each of the first and second LED die sets includes a plurality of LED dies. The LED dies of each of the first and second LED die sets emit light beams of a plurality of colors that corresponds to the plurality of LED dies. Each of the first and second light pipes has an output face, an input face configured to receive a light beam, and a body extending from the input face to the output face, a cross-section of the body of the first light pipe rotating along a central axis extending between the input face and the output face. The first and second light pipe holders are configured to hold the first and second light pipes in positions optically coupled to the first and second LED die sets.

In a second embodiment, a luminaire includes a plurality of LED die sets, a plurality of light pipes corresponding to the LED die sets, and a plurality of light pipe holders corresponding to the light pipes. Each of the LED die sets includes a plurality of LED dies. The LED dies of at least one LED die set emit light beams of a plurality of colors that corresponds to the plurality of LED dies. The light pipe holders are configured to hold their corresponding light pipes in positions optically coupled to corresponding LED die sets. The light pipe corresponding to the at least one LED die set has an output face, an input face configured to receive a light beam, and a body extending from the input face to the output face. A cross-section of the body rotates along a central axis extending between the input face and the output face.

BRIEF DESCRIPTION OF THE DRAWINGS

For a more complete understanding of this disclosure, reference is now made to the following brief description, taken in conjunction with the accompanying drawings in which like reference numerals indicate like features.

DETAILED DESCRIPTION

Preferred embodiments are illustrated in the figures, like numerals being used to refer to like and corresponding parts of the various drawings.

Disclosed herein is an LED optical system including a plurality of light pipes having asymmetric cross-sections mounted in a common rotational orientation and having polygonal output faces.

Figure 1:
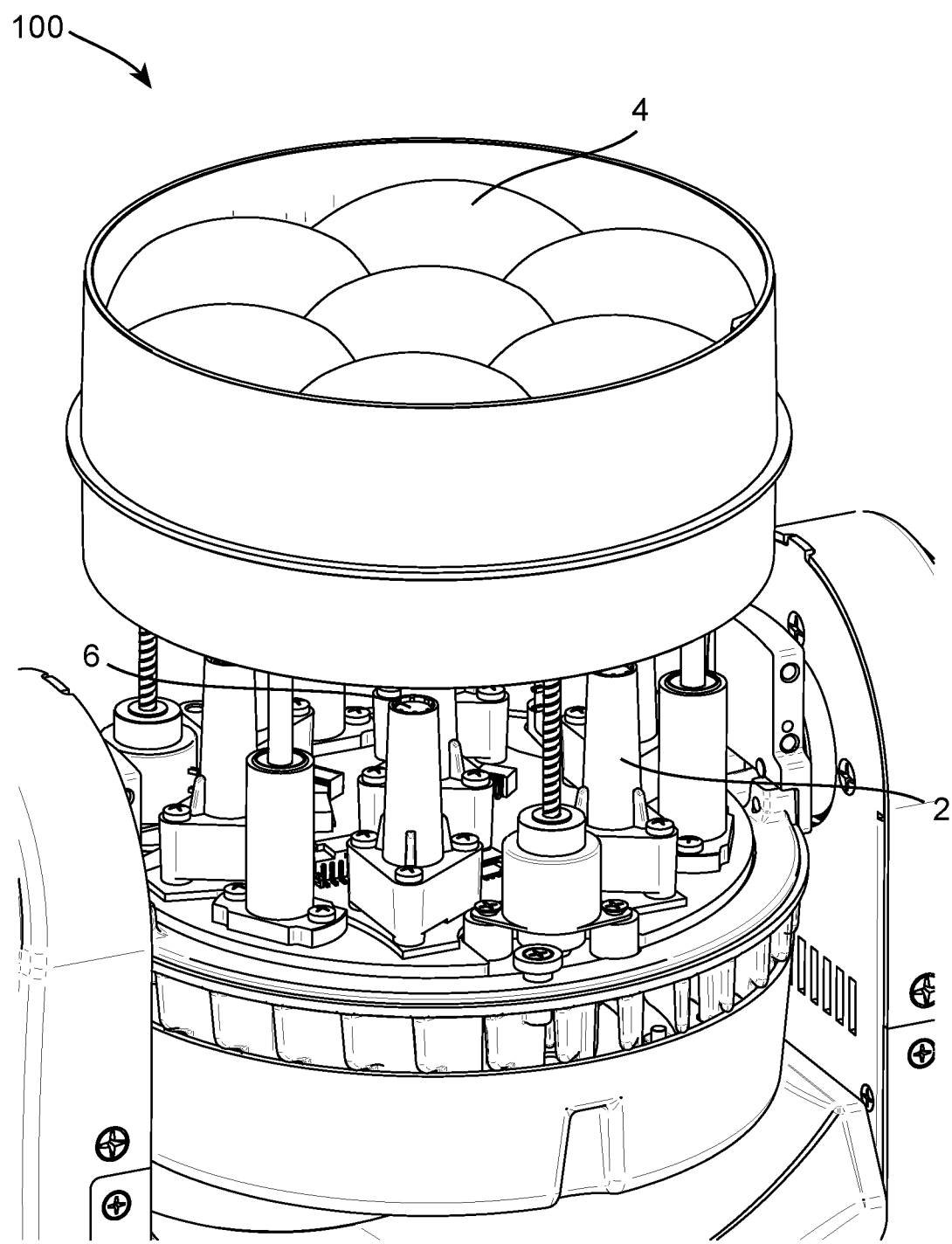
FIG. 1 shows an automated luminaire according to the disclosure.

FIG. 1 shows an automated luminaire 100 according to the disclosure. The luminaire 100 includes a plurality of LED modules 2. Each LED module 2 includes a multi-chip LED (not shown in FIG. 1) with a plurality of LED dies. Each LED die may be a different color. Each LED module 2 further includes a light pipe or integrating rod (not shown in FIG. 1) configured to homogenize the brightness and/or color of the light beams from the LED dies, and may also include a diffusion optical element 6, on an exit end of a light pipe of the LED module 2.

Figure 2:
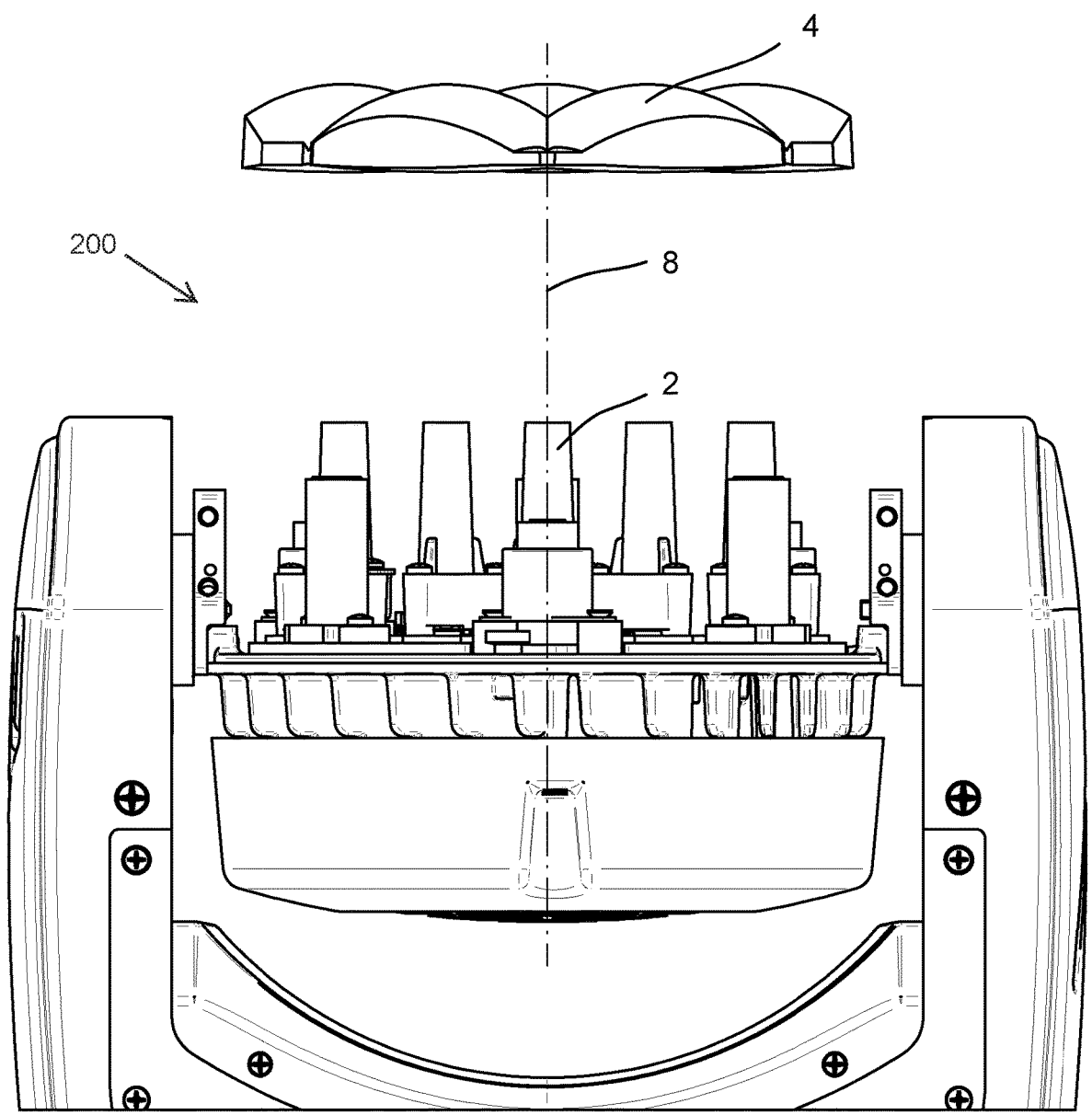
FIG. 2 presents a partial side view of the optical system of FIG. 1 in a first configuration.

FIG. 2 presents a partial side view of an optical system 200 in a first configuration. The optical system 200 is shown installed in the automated luminaire 100, but may be installed in other types of luminaires in other embodiments. The LED modules 2 emit light towards and through a lens array 4. The lens array 4 may contain a plurality of individual lens sections, one for each LED module 2. The lens array 4 is configured to move towards and away from the LED modules 2 along an optical axis 8 of the automated luminaire 100. In some embodiments, mechanical actuators that are controlled remotely are configured to move the lens array 4. In a first configuration of the optical system 200 shown in FIG. 2, the lens array 4 has been moved away from the LED modules 2 and the optical system 200 emits a narrow light beam.

Figure 3:
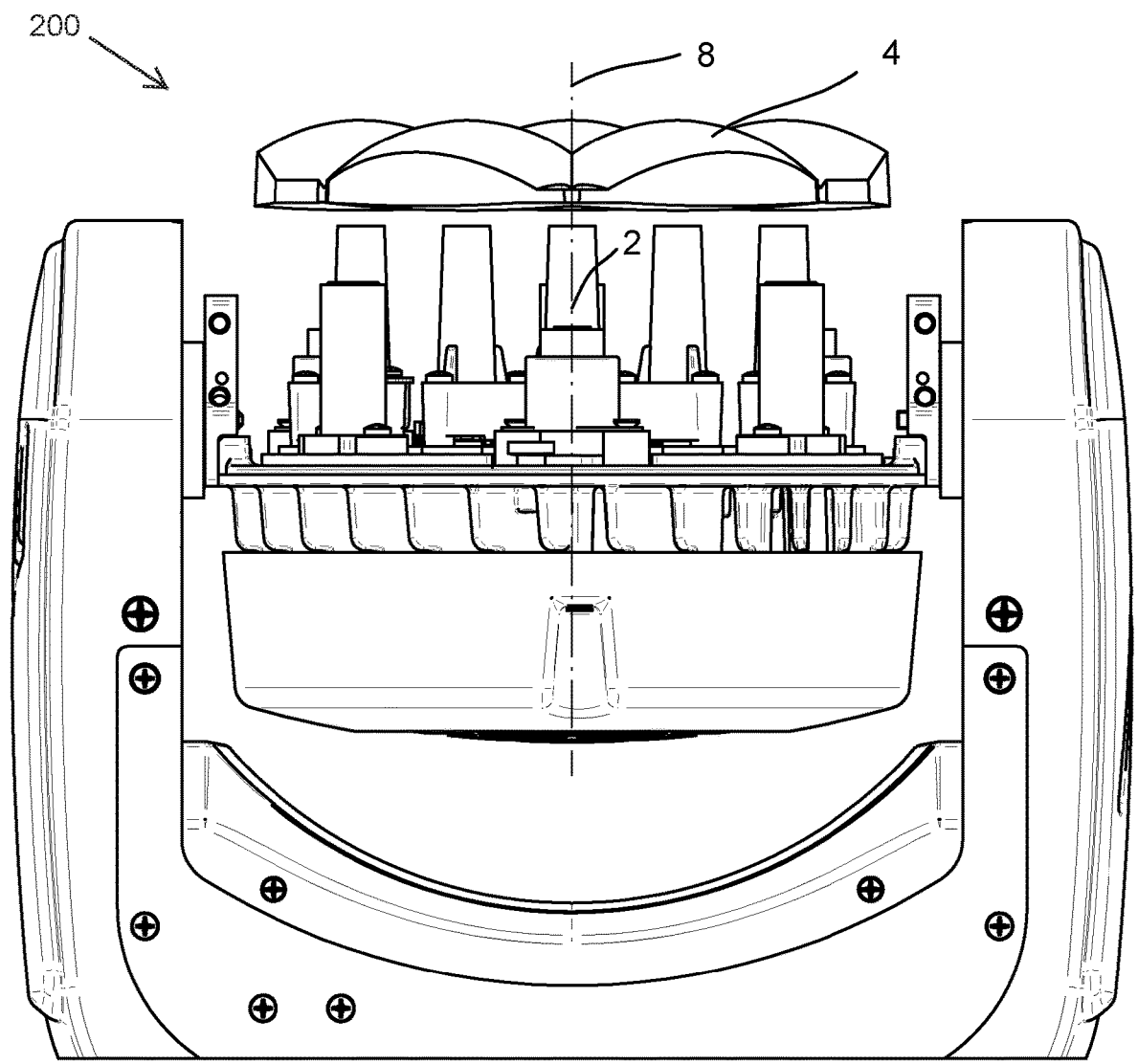
FIG. 3 presents a partial side view of the optical system of FIG. 1 in a second configuration.

FIG. 3 presents a partial side view of the optical system 200 in a second configuration. In the second configuration shown in FIG. 3, the lens array 4 has been moved close to the LED modules 2 and the optical system 200 emits a wide light beam. Thus, the lens array 4 is configured to control a beam angle of the optical system 200 by moving along the optical axis 8 toward and away from the LED modules 2.

Figure 4:
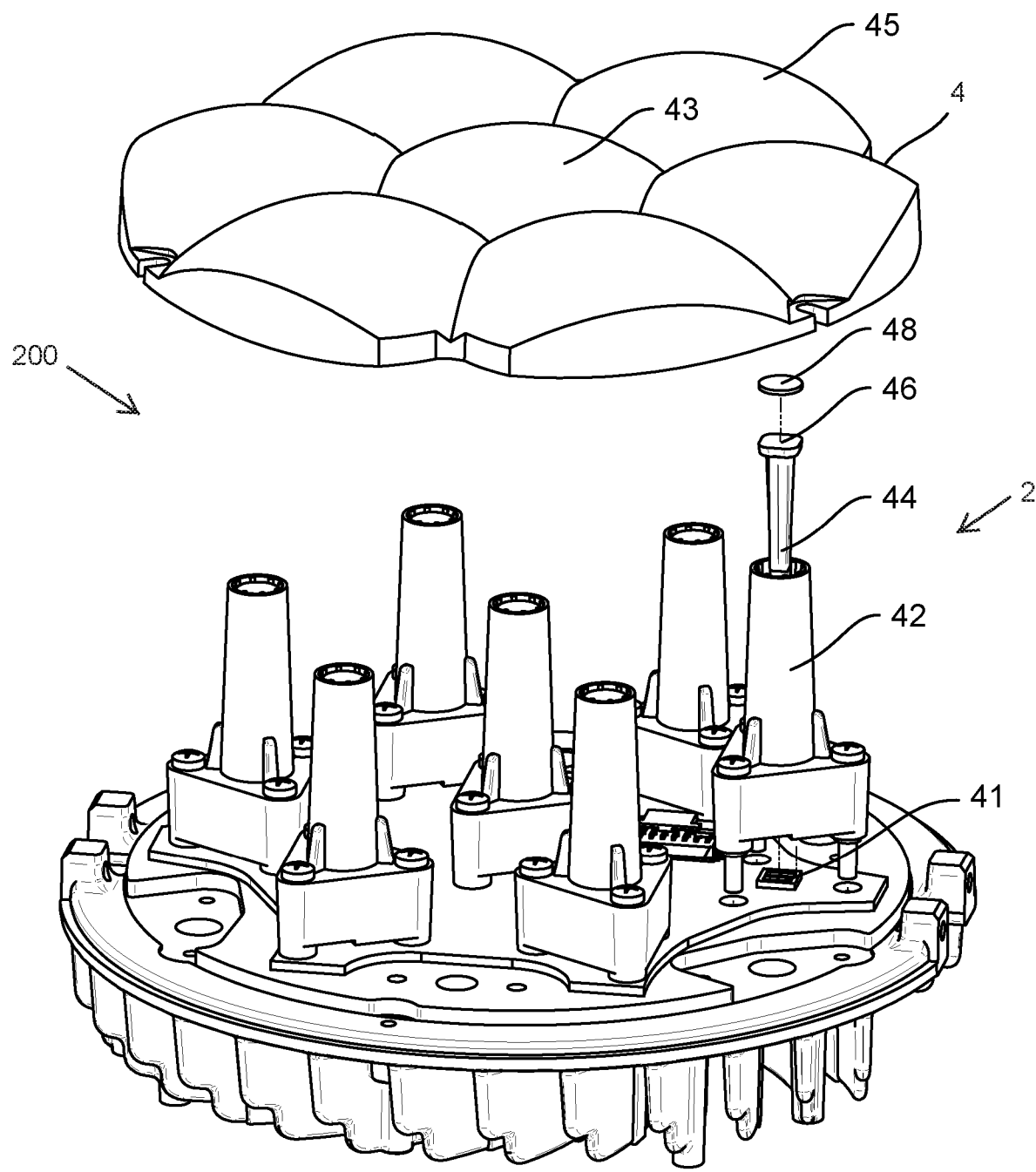
FIG. 4 shows an exploded isometric view of the optical system of FIG. 1.

FIG. 4 shows an exploded isometric view of the optical system 200. The LED module 2 includes an LED die set 41 that emits light into a light pipe 44 that is mounted in a light pipe holder 42. An output face 46 of the light pipe 44 is capped with a diffusing foil 48 that is configured to further homogenize a light beam emitted from the light pipe 44. While a diffusing foil is shown in FIG. 4, in other embodiments other diffusing optical elements may be used. In one embodiment, the diffusing foil 48 may be secured within light pipe holder 42 via teeth on the inside rim inside of the light pipe holder 42, just below its edge. In another embodiment, the diffusing foil 48 may be secured within light pipe holder 42 via ultrasonic welding techniques that mechanically couple the diffusing foil 48 to the light pipe holder 42 or create protrusions from the inside surface of the light pipe holder 42 to hold the diffusion foil 48 in place. In yet other embodiments, adhesives, tape, or other mechanical fixing materials may be used to attach the diffusing foil 48 to the light pipe 44 and/or the light pipe holder 42.

The lens array 4 of the optical system 200 includes a center lens 43, which is hexagonal in shape, surrounded by a first ring of lenses 45, each of which has a first trapezoidal shape.

Figure 5:
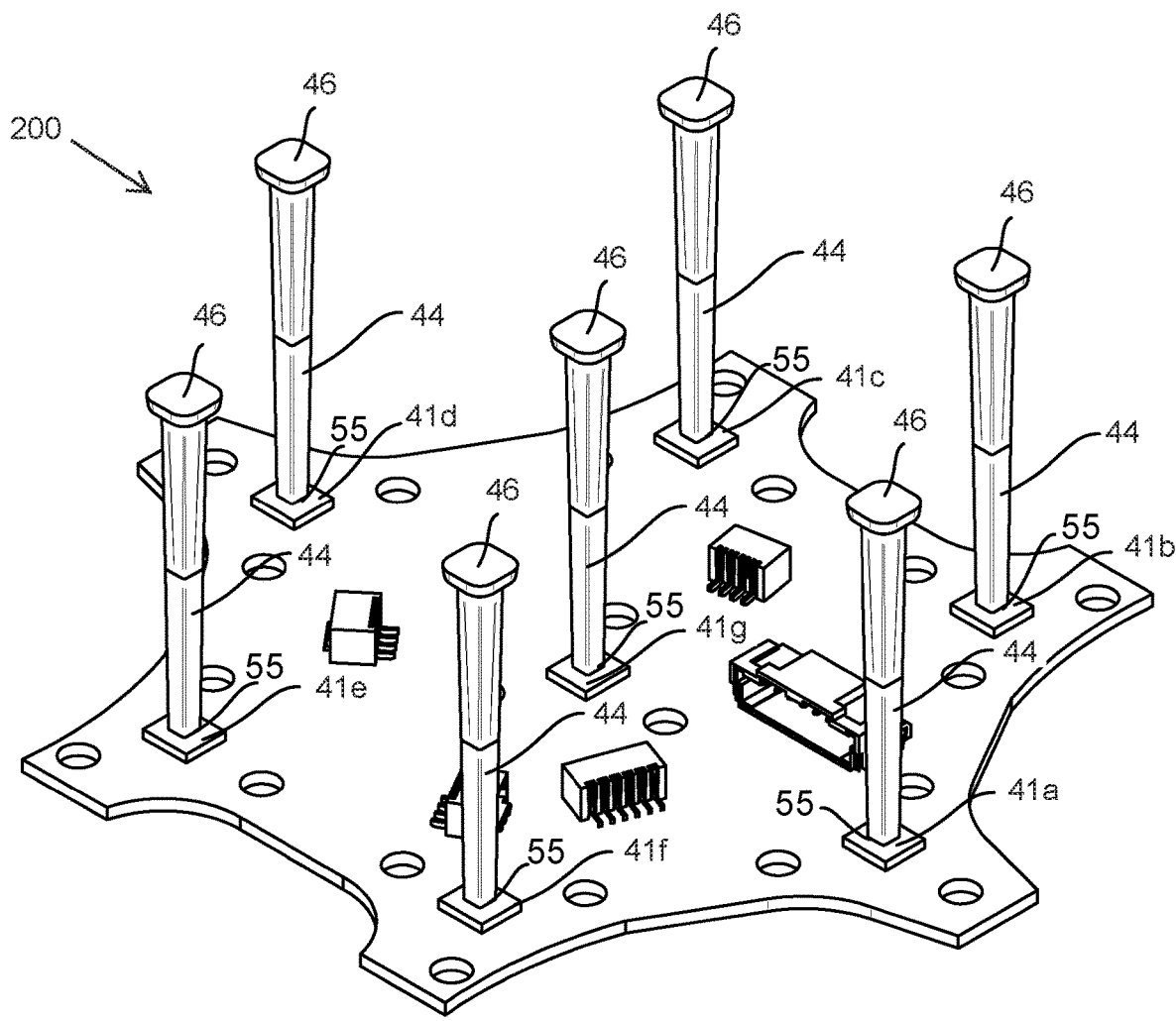
FIG. 5 shows an isometric detail view of elements of the LED modules of the optical system of FIG. 1.

FIG. 5 shows an isometric detail view of elements of the LED modules of the optical system 200. The optical system 200 includes seven light pipes 44. Each light pipe 44 comprises an asymmetrical input face 55 (as described in more detail with reference to FIG. 7) and is oriented within its holder (not shown in FIG. 5) with its asymmetry pointed in the same direction as all other light pipes 44. While the light pipe holders 42 are mounted in differing orientations, each light pipe 44 is mounted within its holder with the same rotational orientation along its optical axis relative to the optical system 200. The input face 55 of each light pipe 44 is positioned close to its associated LED die set 41a-g and is configured to capture the light from its associated LED die set. The output face 46 of each light pipe 44 is a rounded rectangle. In other embodiments, an output face of a light pipe according to the disclosure may be a regular polygon having five or more sides with sharp or rounded vertices between some or all faces. In all embodiments, the shape of the output is configured to produce a light beam that is closer to a circular beam than to the square beam produced by an output face having a square cross-section.

As discussed in more detail with reference to FIG. 9, in some embodiments light pipes according to the disclosure include a body that twists along its central axis. Where some light pipes twist by different amounts than other light pipes, the resulting apparent rotation of the square LED die sets will also contribute to produce a more circular light beam.

Figure 6:
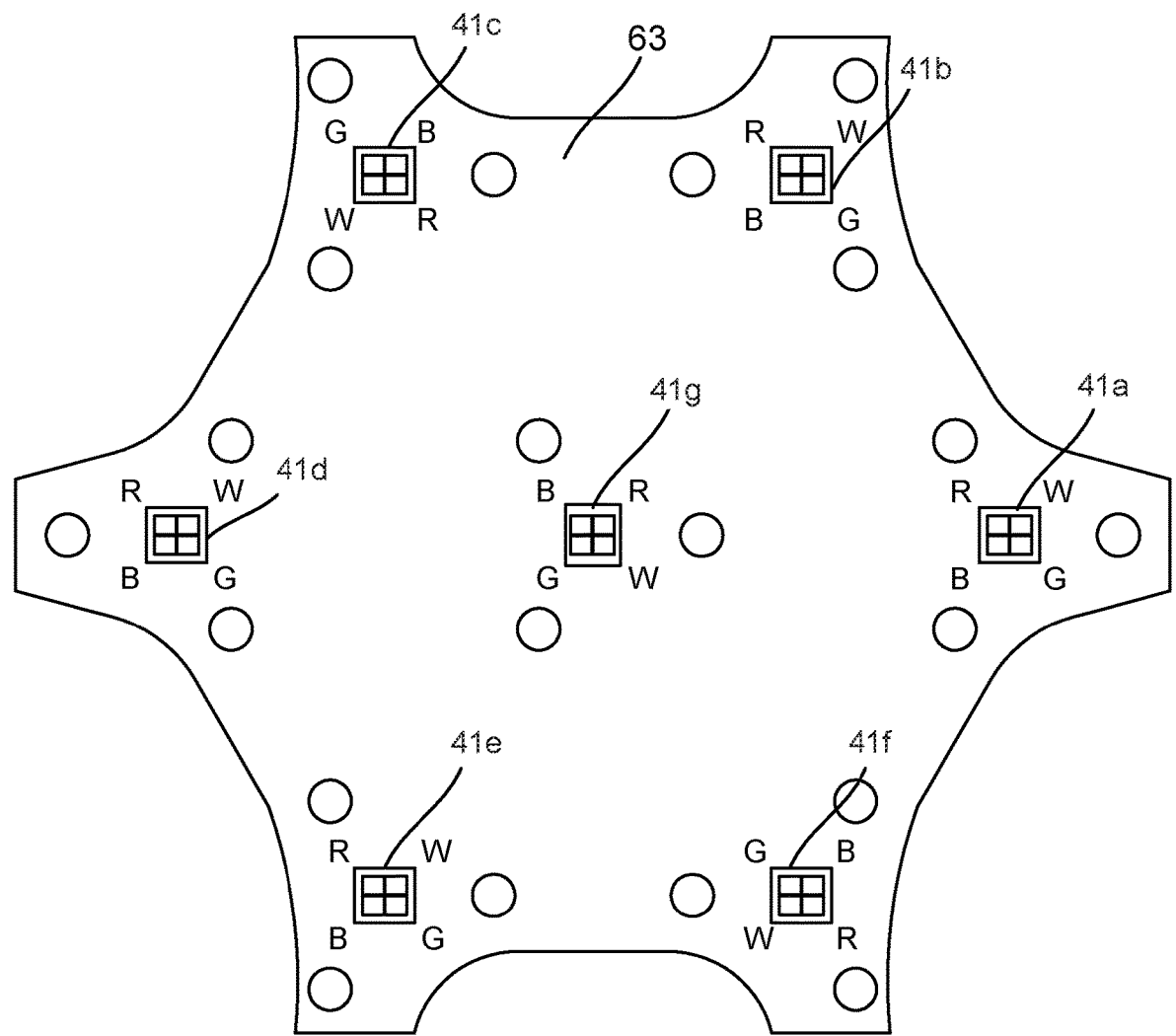
FIG. 6 shows a top detail view of LED die sets of the optical system of FIG. 1.

FIG. 6 shows a top detail view of LED die sets 41a-g of the optical system 200. The LED die sets 41a-g are mounted on a substrate 63. Each LED die set includes a plurality of LEDs, each of which emits a light beam of a different color. In the embodiment shown in FIG. 6, each LED die set includes four LEDs, one each of a red, green, blue, and white LED die, indicated by the letters R, G, B, and W respectively in FIG. 6. The LED die sets 41a-g are configured with their colored LED dies in different positions relative to each other to improve an even coloring of the combined light beam emitted by the LED die sets and their associated lenses and to reduce color fringes or casts in the combined light beam.

While the different colors disclosed in FIG. 6 are the primary colors red, green, blue, and white, it will be understood that in other embodiments LEDs of different colors may emit light in different shades of white, light of different color temperatures, or light having different color spectra.

Figure 7:
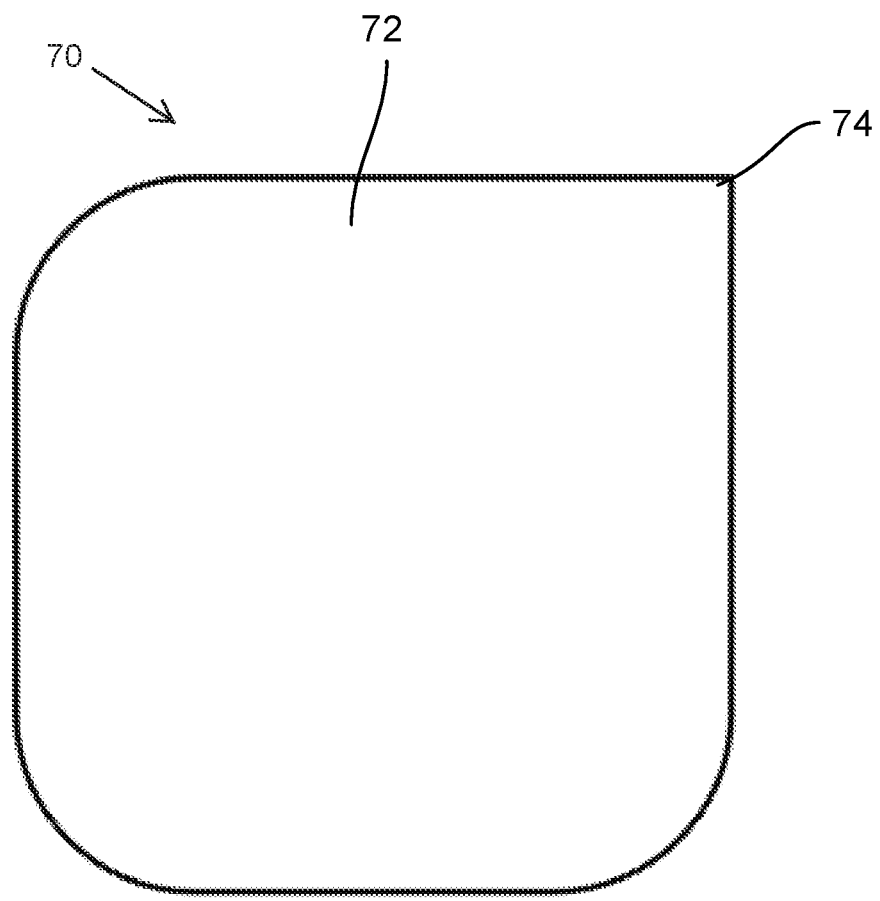
FIG. 7 shows a cross-section view of an input face of a light pipe according to the disclosure.

FIG. 7 shows a cross-section view of an input face 72 of a light pipe 70 according to the disclosure. The input face 72 has a polygonal shape and includes an asymmetrical feature 74. A polygonal face of a light pipe according to the disclosure includes more than two sides, as well as vertices or corners between faces that may be sharp or rounded. The asymmetrical feature 74 ensures that all light pipes 70 in a luminaire may be positioned with the same rotational orientation along an axis that extends from the light pipe's input face to its output face. That is, all light pipes 70 may be positioned with their asymmetrical features 74 rotated in the same direction.

Light pipes may be manufactured by molding a suitable optical material. Molds typically introduce manufacturing artifacts, such as parting lines, into products produced from the mold. By including an asymmetrical feature in a light pipe according to the disclosure, all light pipes in a luminaire may be mounted in a common rotational orientation thereby reducing variation in a beam emitted by the luminaire where the variation results from manufacturing artifacts in the light pipes.

Figure 8:
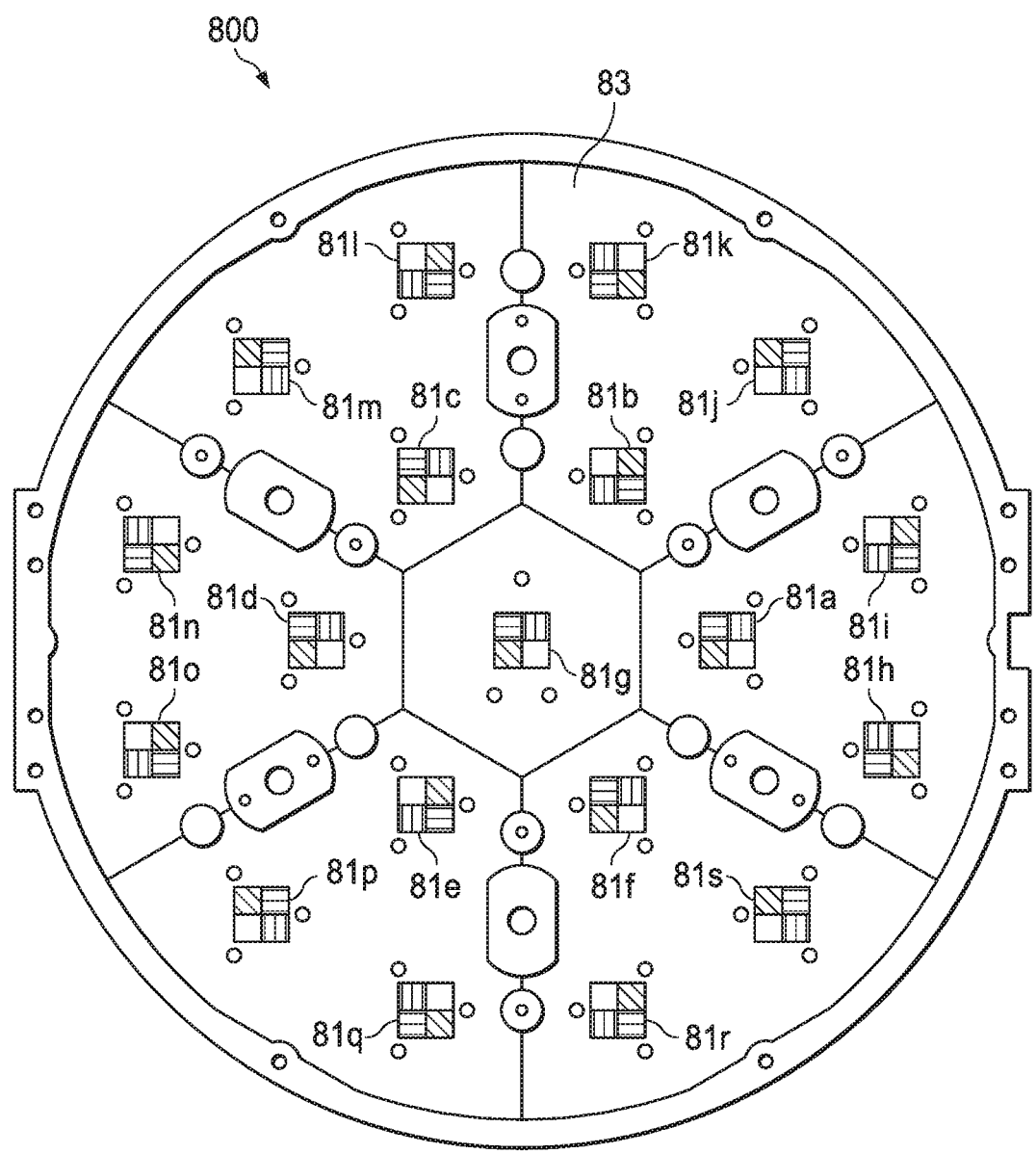
FIG. 8 shows a top detail view of a second optical system according to the disclosure.

FIG. 8 shows a top detail view of a second optical system 800 according to the disclosure. LED die sets of the optical system 800 are arranged on a substrate 83 with a central LED die set 81g, a first ring of LED die sets 81a-f surrounding the central LED die set 81g, and a second ring of LED die sets 81h-s surrounding the first ring of LED die sets 81a-f.

Figure 9:
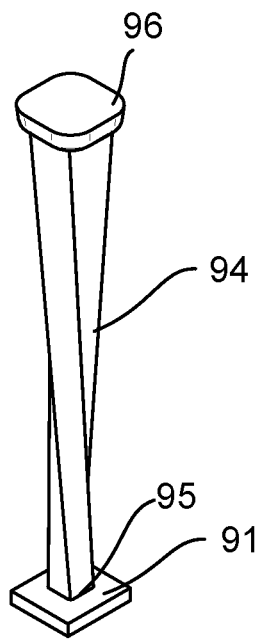
FIG. 9 shows a second light pipe according to the disclosure.

FIG. 9 shows a second light pipe 94 according to the disclosure. The light pipe 94 is mounted with its input face 95 optically coupled to an LED die set 91. A cross-section of a body of the light pipe 94 rotates (or twists) along a central axis of the light pipe 94, the central axis extending between the square input face 95 and a polygonal output face 96. The light pipe 94 twists through a turn of 90°. In other embodiments, light pipes according to the disclosure may rotate along their lengths by amounts of more than or less than 90°. The light pipes 44 and 94 may be used in any optical system according to the disclosure. In some embodiments, different light pipes in an optical system according to the disclosure may rotate along their length by different amounts or in different directions.

Light pipes may be twisted so as to optically rotate the orientation of their associated LED die set. As described with reference to FIG. 6, rotating LED die sets reduces or eliminates a color cast to one side of a combined beam produced from the LED die sets, instead distributing the colors more evenly distributed in every direction. Twisting different light pipe by different amounts further aids this even distribution of LED colors. Additionally light pipes may be twisted by angles other than the increments of 90° that conventional circuit board design imposes on LED die set mounting. By combining LED die set rotation with light pipes having differing amounts of twist, a wider range of apparent orientations of the LED die sets can be obtained.

For shorter twisted light pipes, a twist of greater than 180° could result in light loss from the light pipe due to sharp internal angles. However, by intermixing light pipes that rotate in both directions, clockwise and counter-clockwise, an optical system according to the disclosure may obtain an effective twist range of −180° to +180°, thereby further increasing the range of possible angles of apparent orientations of the LED die sets. In some such embodiments, this expanded effective twist range allows all LED die sets to be mounted in the same orientation while still obtaining well distributed colors over the combined beam, allowing all LED die sets to be mounted on the circuit board in the same orientation.

Figure 10:
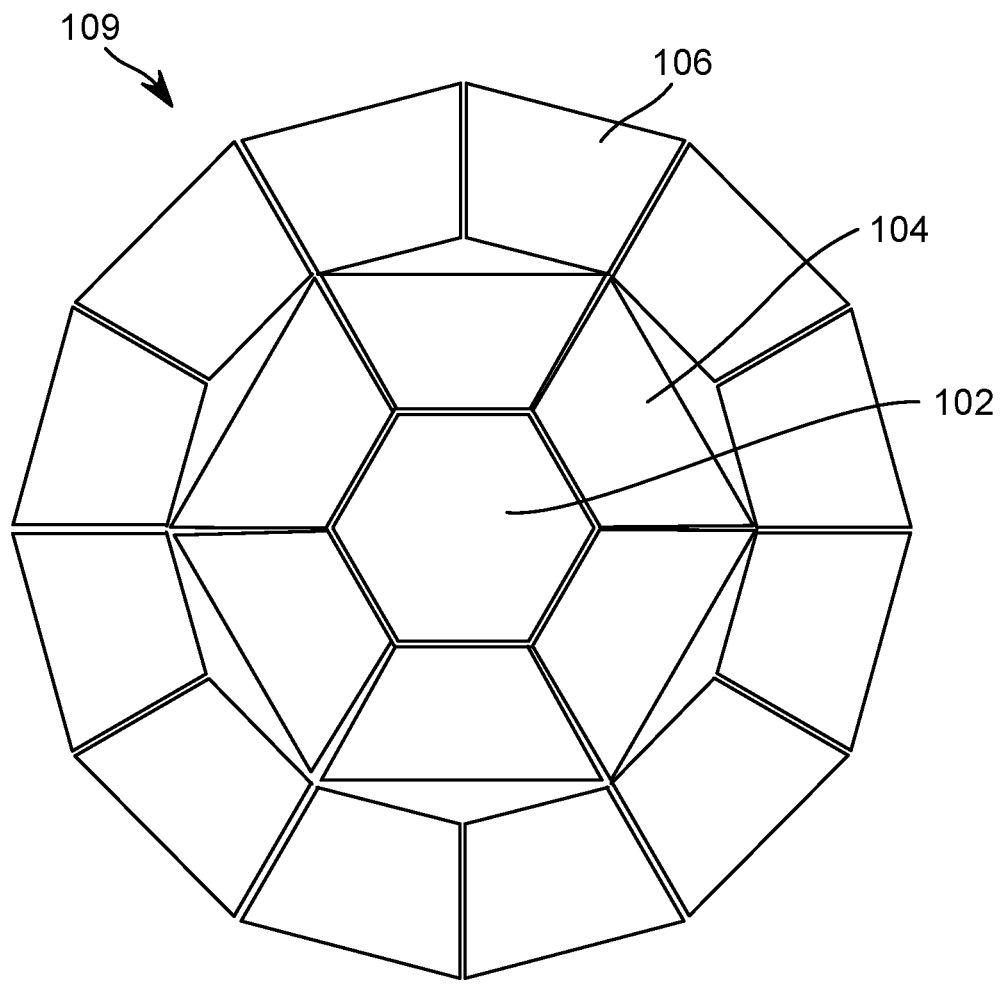
FIG. 10 shows a second array of lenses according to the disclosure.

FIG. 10 shows a second array of lenses 109 according to the disclosure. The lens array 109 is suitable for use with the optical system 800, described with reference to FIG. 8. Lens array 109 includes a center lens 102, which is hexagonal in shape, surrounded by a first ring of lenses 104, each of which has a first trapezoidal shape. The first ring of lenses 104 is surrounded by a second ring of lenses 106, each of which has a second trapezoidal shape.

While the disclosure has been described with respect to a limited number of embodiments, those skilled in the art, having benefit of this disclosure, will appreciate that other embodiments may be devised which do not depart from the scope of the disclosure herein. While the disclosure has been described in detail, it should be understood that various changes, substitutions and alterations can be made hereto without departing from the spirit and scope of the disclosure.

What is claimed is:

1. An optical system comprising:
   first and second light-emitting diode (LED) die sets, each LED die set comprising a plurality of LED dies;
   first and second light pipes, each comprising an input face configured to receive a light beam, the input face comprising an asymmetrical feature; and
   first and second light pipe holders configured to hold the first and second light pipes, respectively, in positions optically coupled to the first and second LED die sets, respectively,
   the second light pipe holder configured to hold the second light pipe with its asymmetrical feature oriented in the same direction as the asymmetrical feature of the first light pipe.

2. The optical system of claim 1, wherein at least one of the first and second light pipes comprises an output face, and a cross-section of a body of the at least one light pipe rotates along a central axis between the input face and the output face of the at least one light pipe.

3. The optical system of claim 2, wherein the cross-section of the body of the at least one light pipe rotates by a first amount along the central axis between the input face and the output face of the at least one light pipe, and a cross-section of a body of the other one of the first and second light pipes rotates by a second amount along a central axis between the input face and the output face of the second light pipe.

4. The optical system of claim 1, wherein at least one of the first and second light pipes comprises an output face having a polygonal cross-section with five or more sides.

5. The optical system of claim 1, further comprising a diffusing optical element configured to homogenize a light beam emitted from at least one of the first and second light pipes.

6. The optical system of claim 1, wherein the plurality of LED dies of at least one of the first and second LED die sets emits light beams of a plurality of colors corresponding to the plurality of LED dies.

7. The optical system of claim 1, wherein the plurality of LED dies of each of the first and second LED die sets emits light beams of a plurality of colors corresponding to the plurality of LED dies, each plurality of dies emitting the same plurality of colors, and the colored LED dies of the first and second LED die sets are configured respectively in first and second positions relative to each other, the first configuration of positions different from the second configuration of positions.

8. The optical system of claim 1, further comprising first and second lenses optically coupled to the first and second light pipes, respectively, the first and second lenses configured to move toward and away from the first and second light pipes along an optical axis of the optical system to control a beam angle of the optical system.

9. A luminaire comprising:
   a plurality of light-emitting diode (LED) die sets, each LED die set comprising a plurality of LED dies;
   a plurality of light pipes corresponding to the plurality of LED die sets, each light pipe comprising an input face, the input face comprising an asymmetrical feature; and
   a plurality of light pipe holders corresponding to the plurality of light pipes, each light pipe holder configured to hold a corresponding one of the plurality of light pipes in a position optically coupled to a corresponding one of the plurality of LED die sets,
   each of the plurality of light pipe holders configured to hold the corresponding light pipe with its asymmetrical feature oriented in the same direction as the asymmetrical features of other light pipes of the plurality of light pipes.

10. The luminaire of claim 9, wherein the plurality of LED die sets and the corresponding plurality of light pipes are arranged in an array.

11. The luminaire of claim 10, wherein a first one of the plurality of LED die sets is positioned in a center of the array, a first subset of the remaining ones of the plurality of LED die sets are arranged in a ring around the first LED die set, and a second subset of the remaining ones of the plurality of LED die sets are arranged in a ring around the first subset of LED die sets.

12. The luminaire of claim 10, further comprising a plurality of lenses corresponding to the plurality of light pipes, each lens optically coupled to a corresponding one of the plurality of light pipes, the plurality of lenses arranged in an array corresponding to the array of light pipes.

13. The luminaire of claim 12, wherein the array of lenses is configured to move toward and away from the plurality of light pipes along an optical axis of the luminaire to control a beam angle of a light beam emitted by the luminaire, the luminaire further comprising a mechanical actuator configured to be controlled remotely and to move the array of lenses toward and away from the plurality of light pipes.

14. The luminaire of claim 9, wherein a first light pipe of the plurality of light pipes comprises an output face, and a cross-section of a body of the first light pipe rotates by a first amount along a central axis between the input face and the output face of the first light pipe.

15. The luminaire of claim 14, wherein a second light pipe of the plurality of light pipes comprises an output face, and a cross-section of a body of the second light pipe rotates by a second amount along a central axis between the input face and the output face of the first light pipe.

16. The luminaire of claim 9, wherein at least one of the plurality of light pipes comprises an output face having a polygonal cross-section with five or more sides.

17. The luminaire of claim 9, further comprising a diffusing optical element configured to homogenize a light beam emitted from at least one of the plurality of light pipes.

18. The luminaire of claim 9, wherein the plurality of LED dies of at least one of the plurality of LED die sets emits light beams of a corresponding plurality of colors.

19. The luminaire of claim 18, wherein a brightness of one or more of the LED dies of the at least one of the plurality of LED die sets is configured to be controlled remotely.

20. The luminaire of claim 9, wherein the plurality of LED dies of each of the plurality of LED die sets emits light beams of a plurality of colors corresponding to the plurality of LED dies, each plurality of dies emitting the same plurality of colors, and the colored LED dies of at least first and second ones of the plurality of LED die sets are configured respectively in first and second positions relative to each other, the first configuration of positions different from the second configuration of positions.

* * * * *